(12) United States Patent
Chuang et al.

(10) Patent No.: US 10,056,897 B1
(45) Date of Patent: Aug. 21, 2018

(54) POWER-ON CONTROL CIRCUIT WITH STATE-RECOVERY MECHANISM AND OPERATING CIRCUIT UTILIZING THE SAME

(71) Applicant: Vanguard International Semiconductor Corporation, Hsinchu (TW)

(72) Inventors: Jung-Tsun Chuang, Tainan (TW);
Shao-Chang Huang, Hsinchu (TW);
Chieh-Yao Chuang, Kaohsiung (TW);
Hung-Wei Chen, Jhubei (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/791,024

(22) Filed: Oct. 23, 2017

(51) Int. Cl.
| | |
|---|---|
| *H03L 5/00* | (2006.01) |
| *H03K 17/22* | (2006.01) |
| *H03K 19/0185* | (2006.01) |
| *H03K 17/16* | (2006.01) |

(52) U.S. Cl.
CPC ......... *H03K 17/223* (2013.01); *H03K 17/162* (2013.01); *H03K 19/018521* (2013.01)

(58) Field of Classification Search
CPC ............... H03K 17/223; H03K 17/162; H03K 19/018521

USPC .................................... 327/140–144.306, 333
See application file for complete search history.

(56) References Cited

U.S. PATENT DOCUMENTS

| | | | | |
|---|---|---|---|---|
| 5,497,112 A | * | 3/1996 | Hoang | G01R 31/30 327/143 |
| 6,118,315 A | * | 9/2000 | Guedj | G01R 19/16538 327/143 |
| 2009/0302902 A1 | * | 12/2009 | Do | H03K 17/223 327/143 |
| 2012/0256664 A1 | * | 10/2012 | Gunther | H03K 17/223 327/143 |

* cited by examiner

*Primary Examiner* — Dinh T Le
(74) *Attorney, Agent, or Firm* — Birch, Stewart, Kolasch & Birch, LLP

(57) ABSTRACT

A power-on control circuit is provided. A first detection circuit detects the voltage of a first voltage source to generate a first detection signal to a first node. A switching circuit is coupled to the first voltage source and a second voltage source and outputs the voltage of the first voltage source or the voltage of the second voltage source to a second node according to the voltage level of the first node. A first buffer generates a feedback signal and a control signal according to the voltage level of the second node. A second detection circuit generates a second detection signal according to the feedback signal, the control signal, the voltage of the second voltage source and a recovery signal. A second buffer generates the recovery signal according to the second detection signal.

20 Claims, 10 Drawing Sheets

POWER-ON CONTROL CIRCUIT WITH STATE-RECOVERY MECHANISM AND OPERATING CIRCUIT UTILIZING THE SAME

BACKGROUND OF THE INVENTION

Field of the Invention

The invention relates to a power-on control circuit, and more particularly to a power-on control circuit which operates according to a core voltage.

Description of the Related Art

The ongoing development of technology has led to an increase in the functions and types of consumer electronic devices. Generally, each electronic device comprises many integrated circuits (ICs). Each IC may receive many operation voltages. When one operation voltage has not yet reached a target value, and if the IC operates according to the operation voltage, the IC may generate error signals.

BRIEF SUMMARY OF THE INVENTION

In accordance with an embodiment, a power-on control circuit comprises a first detection circuit, a switching circuit, a first buffer, a second detection circuit and a second buffer. The first detection circuit detects the voltage of a first voltage source to generate a first detection signal to a first node. The switching circuit is coupled to the first voltage source and a second voltage source and outputs the voltage of the first voltage source or the voltage of the second voltage source to a second node according to the voltage level of the first node. The first buffer generates a feedback signal and a control signal according to the voltage level of the second node. The second detection circuit generates a second detection signal according to the feedback signal, the control signal, the voltage of the second voltage source and a recovery signal. The second buffer generates the recovery signal according to the second detection signal.

In accordance with another embodiment, an operating circuit comprises a core circuit, a first output switch, a second output switch and a power-on control circuit. The core circuit receives a voltage provided from a first voltage source and a voltage provided from a second voltage source and generates a first control signal and a second control signal. The first output switch transmits the voltage provided from the first voltage source to a pad according to the first control signal. The second output switch transmits a ground voltage to the pad according to the second control signal. The power-on control circuit controls the first and second output switches according to the voltage provided from the first voltage source and the voltage provided from the second voltage source and comprises a first detection circuit, a switching circuit, a first buffer, a second detection circuit and a second buffer. The first detection circuit detects the voltage provided from the first voltage source to generate a first detection signal to a first node. The switching circuit is coupled to the first and second voltage sources and outputs the voltage provided from the first or second voltage source to a second node according to the voltage level of the first node. The first buffer generates a feedback signal and a control signal according to the voltage level of the second node. The second detection circuit generates a second detection signal according to the feedback signal, the control signal, the voltage provided from the second voltage source and a recovery signal. The second buffer generates the recovery signal according to the second detection signal and controls the first and second output switches according to the second detection signal.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Figure 1:
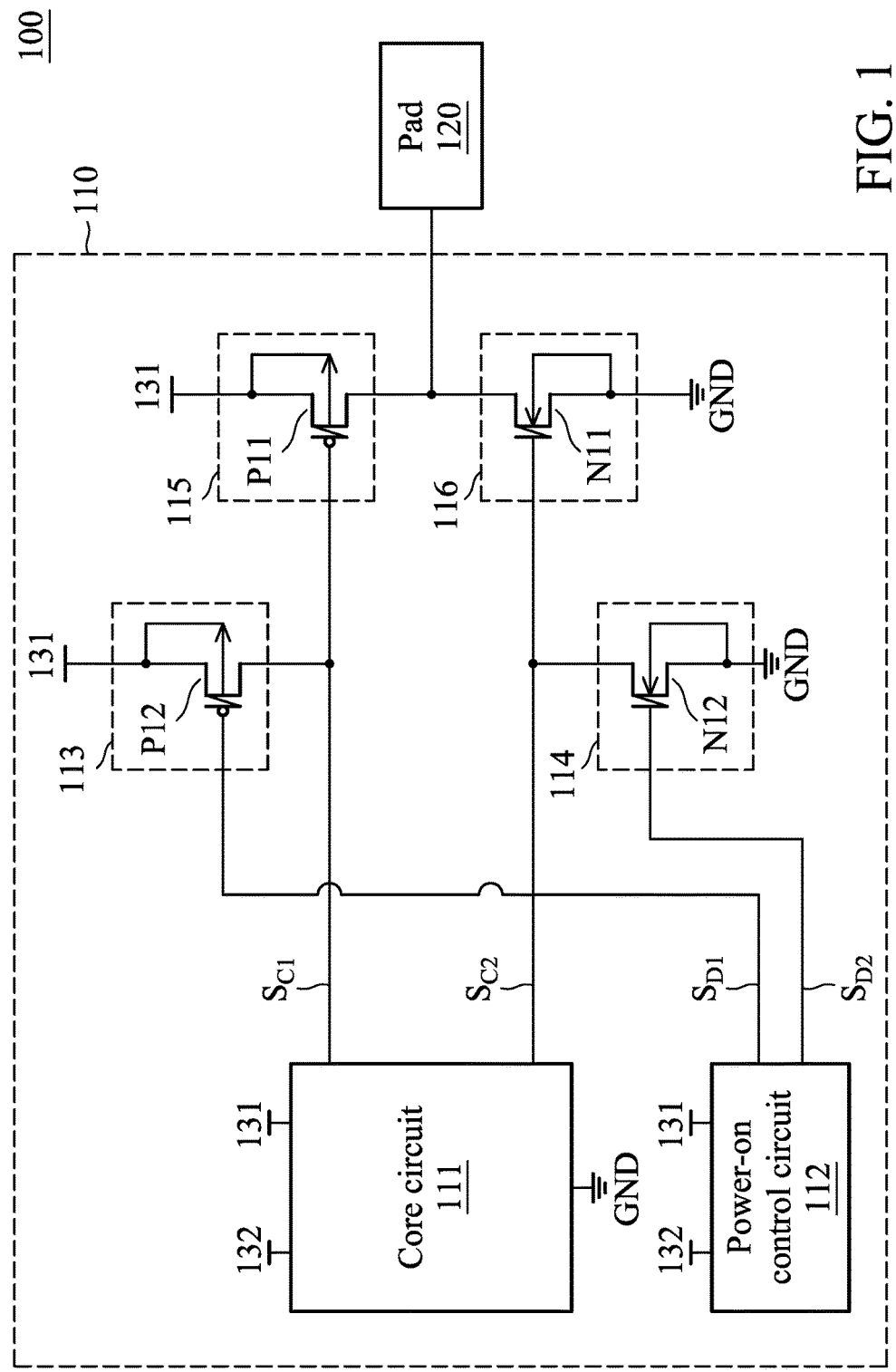
FIG. 1 is a schematic diagram of an exemplary embodiment of an operating system, according to various aspects of the present disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a schematic diagram of an exemplary embodiment of an operating system, according to various aspects of the present disclosure. The operating system 100 comprises an operating circuit 110 and a pad 120. In this embodiment, the operating circuit 110 is configured to control the voltage level of the pad 120. As shown in FIG. 1, the operating circuit 110 comprises a core circuit 111, a power-on control circuit 112, control switches 113 and 114, and output switches 115 and 116. The core circuit 111 is coupled to the voltage sources 131 and 132. In one embodiment, the voltage source 131 is configured to generate an input/output voltage, and the voltage source 132 is configured to generate a core voltage. In this embodiment, the input/output voltage and the core voltage serve as the operation voltages of the core circuit 111. In another embodiment, the input/output voltage is higher than the core voltage. For example, the input/output voltage is about 3.3V and the core voltage is about 1.8V. Additionally, the core circuit 111 also receives a ground voltage GND.

The core circuit 111 operates according to the voltages provided from the voltage sources 131 and 132 and the ground voltage GND and generates control signals $S_{C1}$ and $S_{C2}$ to control the output switches 115 and 116. In this embodiment, the control signal $S_{C1}$ is utilized to turn on or turn off the output switch 115. When the output switch 115 is turned on, the output switch 115 transmits the voltage provided by the voltage source 131 to the pad 120. Therefore, the voltage level pad 120 is a high level. Furthermore, the control signal $S_{C2}$ is utilized to turn on or turn off the output switch 116. When the output switch 116 is turned on, the output switch 116 transmits the ground voltage GND to the pad 120. Therefore, the voltage level pad 120 is a low level.

However, when the voltage sources 131 and 132 start generating voltages, the voltages generated from the voltage sources 131 and 132 are gradually increased from 0V. When the voltage generated from the voltage source 131 reaches a first predetermined value (e.g. 0.7V) and the voltage generated from the voltage source 132 has not reached a second predetermined value (e.g. 0.9V), the core circuit 111 may generate error control signals $S_{C1}$ and $S_{C2}$. When the error control signals $S_{C1}$ and $S_{C2}$ turn on both output switches 115 and 116, a leakage current is passing through the output switches 115 and 116. To solve the problem, the power-on control circuit 112 does not turn on the output switches 115 and 116 when the voltage generated from the voltage source 132 has not reached the second predetermined value.

For example, when the voltage generated from the voltage source 131 reaches the first predetermined value and the voltage generated from the voltage source 132 has not reached the second predetermined value, the power-on control circuit 112 enters a power-on mode. In the power-on mode, the power-on control circuit 112 turns off the output switches 115 and 116. When the voltage generated from the voltage source 131 has reached the first predetermined value and the voltage generated from the voltage source 132 has reached the second predetermined value, the power-on control circuit 112 enters a normal mode. In such mode, the power-on control circuit 112 does not control the output switches 115 and 116. At this time, the output switches 115 and 116 are controlled by the core circuit 111. When the voltage generated from the voltage source 132 is reduced and lower than the second predetermined value, the power-on control circuit 112 enters a power-off mode. In the power-off mode, the power-on control circuit 112 controls the output switches 115 and 116 again and turns off the output switches 115 and 116.

In the disclosure, it is not limited to how the power-on control circuit 112 controls the output switches 115 and 116. In one embodiment, the power-on control circuit 112 generates driving signals $S_{D1}$ and $S_{D2}$ according to the voltages provided from the voltage sources 131 and 132 and utilizes the driving signals $S_{D1}$ and $S_{D2}$ to indirectly control the output switches 115 and 116. For example, when the control switch 113 is turned on by the driving signal $S_{D1}$, the control switch 113 provides the voltage provided from the voltage source 131 to the output switch 115 to turn off the output switch 115. When the control switch 114 is turned on by the driving signal $S_{D2}$, the control switch 114 provides the ground voltage GND to the output switch 116 to turn off the output switch 116. In other embodiments, the control switches 113 and 114 can be omitted. In this case, the power-on control circuit 112 directly connects to the output switches 115 and 116 and utilizes the driving signals $S_{D1}$ and $S_{D2}$ to control the output switches 115 and 116.

Figure 2A:
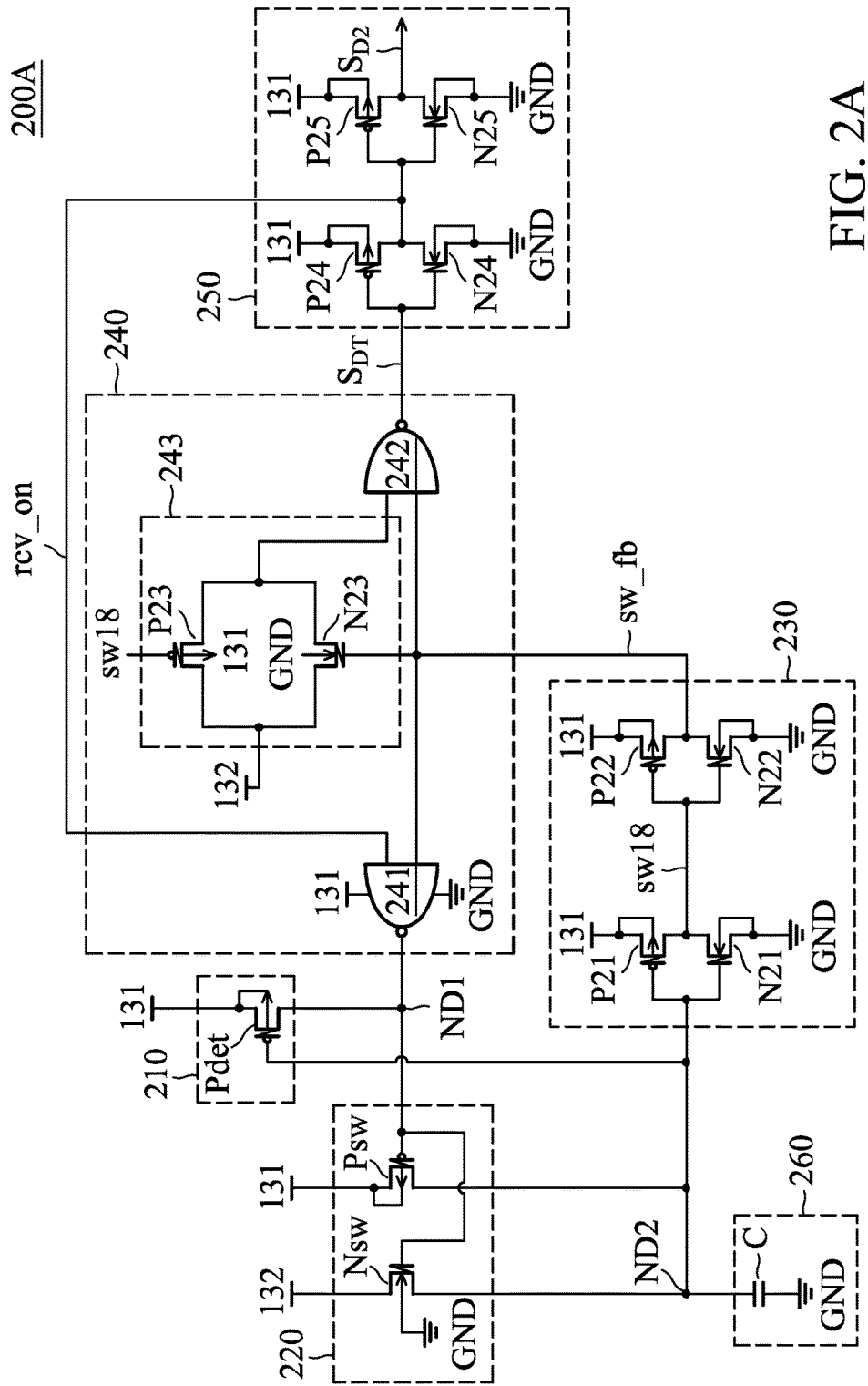
FIG. 2A is a schematic diagram of an exemplary embodiment of a power-on control circuit having a state-recovery mechanism, according to various aspects of the present disclosure.

The internal circuit structures of the control switches 113 and 114 are not limited in the present disclosure. In one embodiment, the control switch 113 is a P-type transistor P12 and the control switch 114 is an N-type transistor N12. As shown in FIG. 2A, The gate of the P-type transistor P12 is coupled to the power-on control circuit 112 to receive the driving signal $S_{D1}$. The source of the P-type transistor P12 is coupled to the voltage source 131. The drain of the P-type transistor P12 is coupled to the output switch 115. When the driving signal $S_{D1}$ is at a low level, the P-type transistor P12 is turned on to transmit the voltage of the voltage source 131 to the output switch 115. Additionally, the gate of the N-type transistor N12 is coupled to the power-on control circuit 112 to receive the driving signal $S_{D2}$. The drain of the N-type transistor N12 is coupled to the output switch 116. The source of the N-type transistor N12 receives the ground voltage GND. When the driving signal $S_{D2}$ is at a high level, the N-type transistor N12 is turned on to transmit the ground voltage GND to the output switch 116. In other embodiments, the control switch 113 is an N-type transistor, and the control switch 114 is a P-type transistor. In some embodiments, the control switches 113 and 114 are N-type transistors or P-type transistors.

In the present disclosure, the internal circuit structures of the output switches 115 and 116 are not limited. In this embodiment, the output switch 115 is a P-type transistor P11, and the output switch 116 is an N-type transistor N11. The gate of the P-type transistor P11 is coupled to the core circuit 111 and the control switch 113. The source of the P-type transistor P11 is coupled to the voltage source 131. The drain of the P-type transistor P11 is coupled to the pad 120. When the P-type transistor P11 is turned on, the P-type transistor P11 transmits the voltage of the voltage source 131 to the pad 120. Additionally, the gate of the N-type transistor N11 is coupled to the core circuit 111 and the control switch 114. The drain of the N-type transistor N11 is coupled to the pad 120. The source of the N-type transistor N11 receives the ground voltage GND. When the N-type transistor N11 is turned on, the N-type transistor N11 transmits the ground voltage GND to the pad 120. In other embodiments, the output switch 115 is an N-type transistor, and the output switch 116 is a P-type transistor. In some embodiments, the output switches 115 and 116 are N-type transistors or P-type transistors.

FIG. 2A is a schematic diagram of an exemplary embodiment of a power-on control circuit having a state-recovery mechanism, according to various aspects of the present disclosure. the power-on control circuit 200A comprises detection circuits 210 and 240, a switching circuit 220 and buffers 230 and 250. The detection circuit 210 detects the voltage provided from the voltage source 131 to generate a detection signal to the node ND1. The invention does not limit the circuit structure of the detection circuit 210. In this embodiment, the detection circuit 210 is a P-type transistor Pdet. The gate of the P-type transistor Pdet is coupled to the node ND2. The source of the P-type transistor Pdet is coupled to the voltage source 131. The drain of the P-type transistor Pdet is coupled to the node ND1.

The switching circuit 220 is coupled to the voltage sources 131 and 132 and outputs the voltage of the voltage source 131 or 132 to the node ND2 according to the voltage level of the node ND1. For example, when the voltage level of the node ND1 is a high level, the switching circuit 220 outputs the voltage provided from the voltage source 132 to the node ND2. When the voltage level of the node ND1 is a low level, the switching circuit 220 outputs the voltage provided from the voltage source 131 to the node ND2. The invention is not limited to the circuit structure of the switching circuit 220. In this embodiment, the switching circuit 220 comprises a P-type transistor Psw and an N-type transistor Nsw. The gate of the P-type transistor Psw is coupled to the node ND1. The source of the P-type transistor Psw is coupled to the voltage source 131. The drain of the P-type transistor Psw is coupled to the node ND2. When the voltage level of the node ND1 is a low level, the P-type transistor Psw is turned on to transmit the voltage of the voltage source 131 to the node ND2. The gate of the N-type transistor Nsw is coupled to the node ND1. The drain of the N-type transistor Nsw is coupled to the voltage source 132. The source of the N-type transistor Nsw is coupled to the node ND2. When the voltage level of the node ND1 is a high level, the N-type transistor Nsw is turned on to transmit the voltage provided from the voltage source 132 to the node ND2.

In one embodiment, the power-on control circuit 200A further comprises a set unit 260. The set unit 260 is configured to set the initial voltage level of the node ND2. In one embodiment, the set unit 260 is a capacitor C. The capacitor C receives the ground voltage GND to set the initial voltage level of the node ND2 at a low level referred to as a first level. In this case, in an initial period, when the voltage of the voltage source 131 reaches a first predetermined value, since the voltage level of the node ND2 is the low level, the P-type transistor Pdet is turned on to transmit the voltage of the voltage source 131 to the node ND1. However, when the voltage of the voltage source 131 is gradually increased and higher than a second predetermined value, the voltage level of the node ND2 is changed from the low level to a high level. Therefore, the P-type transistor Pdet is turned off to stop transmitting the voltage of the voltage source 131 to the node ND1.

The buffer 230 generates a feedback signal sw_fb and a control signal sw18 according to the voltage level of the node ND2. In this embodiment, the level of the feedback signal sw_fb is equal to the voltage level of the node ND2, and the level of the control signal sw18 is opposite to the voltage level of the node ND2. For example, when the voltage level of the node ND2 is a low level, the feedback signal sw_fb is at the low level and the control signal sw18 is at a high level referred to as a second level. When the voltage level of the node ND2 is a high level, the feedback signal sw_fb is at the high level and the control signal sw18 is at a low level. The invention is not limited to the circuit structure of the buffer 230. In this embodiment, the buffer 230 comprises P-type transistors P11 and P21 and N-type transistors N21 and N22. The P-type transistor P21 and the N-type transistor N21 constitute a first inverter, and the P-type transistor P22 and the N-type transistor N22 constitute a second inverter.

The gate of the P-type transistor P21 is coupled to the node ND2. The source of the P-type transistor P21 is coupled to the voltage source 131. The drain of the P-type transistor P21 is coupled to the drain of the N-type transistor N21. The gate of the N-type transistor N21 is coupled to the node ND2. The source of the N-type transistor N21 receives the ground voltage GND. In this embodiment, the voltage in the drain of the N-type transistor N21 serves as the control signal sw18. Additionally, the gate of the P-type transistor P22 receives the control signal sw18. The source of the P-type transistor P22 is coupled to the voltage source 131. The drain of the P-type transistor P22 is coupled to the drain of the N-type transistor N22. The gate of the N-type transistor N22 receives the control signal sw18. The source of the N-type transistor N22 receives the ground voltage GND. In this embodiment, the voltage in the drain of the N-type transistor N22 serves as the feedback signal sw_fb.

The detection circuit 240 generates a detection signal $S_{DT}$ according to the feedback signal sw_fb, the control signal sw18, the voltage generated from the voltage source 132 and a recovery signal rcv_on. In this embodiment, when the voltage generated from the voltage source 131 reaches a first predetermined value and the voltage generated from the voltage source 132 has not reached a second predetermined value, the detection circuit 240 generates the detection signal $S_{DT}$ having a high level. When the voltage generated from the voltage source 131 reaches the first predetermined value and the voltage generated from the voltage source 132 reaches the second predetermined value, the detection circuit 240 changes the level of the detection signal $S_{DT}$ from the high level to a low level. However, when the voltage generated from the voltage source 132 is reduced and lower than the second predetermined value, the detection circuit 240 changes the level of the detection signal $S_{DT}$ from the low level to the high level. Since the detection signal $S_{DT}$ is recovered from the low level to the high level, the detection circuit 240 serves as a state-recovery mechanism.

The invention is not limited to the circuit structure of the detection circuit 240. In one embodiment, the detection circuit 240 comprises logic circuits 241 and 242 and a transmission gate 243. The transmission gate 243 is coupled to the voltage source 132 and transmits the voltage generated from the voltage source 132 to the logic circuit 242 according to the feedback signal sw_fb and the control signal sw18. In this embodiment, the transmission gate 243 comprises a P-type transistor P23 and an N-type transistor N23. The gate of the P-type transistor P23 receives the control signal sw18. The source of the P-type transistor P23 is coupled to the voltage source 132. The drain of the P-type transistor P23 is coupled to the logic circuit 242. The gate of the N-type transistor N23 receives the feedback signal sw_fb. The drain of the N-type transistor N23 is coupled to the voltage source 132. The source of the N-type transistor N23 is coupled to the logic circuit 242. Furthermore, the bulk of the P-type transistor P23 is coupled to the voltage source 131, and the bulk of the N-type transistor N23 receives the ground voltage GND.

The logic circuit 242 outputs the detection signal $S_{DT}$ according to the feedback signal sw_fb and the voltage generated from the voltage source 132. For example, when the feedback signal sw_fb is at a low level, the logic circuit 242 outputs the detection signal $S_{DT}$ having a high level. When the feedback signal sw_fb is at the high level and the voltage generated from the voltage source 132 reaches the second predetermined value, the logic circuit 242 outputs the detection signal $S_{DT}$ having the low level. However, when the feedback signal sw_fb is at the high level and the voltage generated from the voltage source 132 is lower than the second predetermined value, the logic circuit 242 outputs the detection signal $S_{DT}$ having the high level. The invention is not limited to the circuit structure of the logic circuit 242. In this embodiment, the logic circuit 242 is an NAND.

The logic circuit 241 receives the feedback signal sw_fb and the recovery signal rcv_on and is coupled to the node ND1. When the voltage generated from the voltage source 131 reaches the first predetermined value and the voltage generated from the voltage source 132 has not reached the second predetermined value, since the feedback signal sw_fb is at a low level, the logic circuit 241 outputs a high level to the node ND1. When the voltage generated from the voltage source 132 reaches the second predetermined value, the logic circuit 241 outputs a low level to the node ND1. The invention is not limited to the circuit structure of the logic circuit 241. In this embodiment, the logic circuit 241 is an NAND.

The buffer 250 generates the recovery signal rcv_on according to the detection signal $S_{DT}$. In one embodiment, the level of the recovery signal rcv_on is opposite to the level of the detection signal $S_{DT}$. For example, when the detection signal $S_{DT}$ is at a high level, the recovery signal rcv_on is at a low level. When the detection signal $S_{DT}$ is at a low level, the recovery signal rcv_on is at a high level. In one embodiment, the recovery signal rcv_on can serve as the driving signal $S_{D1}$ shown in FIG. 1. In another embodiment, the buffer 250 further generates the driving signal $S_{D2}$ to drive the control switch 114 shown in FIG. 1.

In this embodiment, the buffer 250 comprises a P-type transistor P24 and an N-type transistor N24. The P-type transistor P24 and the N-type transistor N24 constitute a first inverter and invert the level of the detection signal $S_{DT}$ to generate the recovery signal rcv_on. As shown in FIG. 2A, the gate of the P-type transistor P24 receives the detection signal $S_{DT}$. The source of the P-type transistor P24 receives the voltage generated from the voltage source 132. The drain of the P-type transistor P24 is coupled to the drain of the N-type transistor N24 to receive the recovery signal rcv_on. The gate of the N-type transistor N24 receives the detection signal $S_{DT}$. The source of the N-type transistor N24 receives the ground voltage GND.

In other embodiments, the buffer 250 further comprises a P-type transistor P25 and an N-type transistor N25. The P-type transistor P25 and the N-type transistor N25 constitute a second inverter. The second inverter is configured to invert the recovery signal rcv_on to generate the driving signal $S_{D2}$. As shown in FIG. 2A, the gate of the P-type transistor P25 receives the recovery signal rcv_on. The source of the P-type transistor P25 receives the voltage generated from the voltage source 131. The drain of the P-type transistor P25 is coupled to the drain of the N-type transistor N25 to generate the driving signal $S_{D2}$. The gate of the N-type transistor N25 receives the recovery signal rcv_on. The source of the N-type transistor N25 receives the ground voltage GND. In another embodiment, the buffer 250 further comprises a third inverter (not shown). The third inverter inverts the driving signal $S_{D2}$ to generate an inverted signal. The inverted signal may serve as the driving signal $S_{D1}$ of FIG. 1.

Figure 2B:
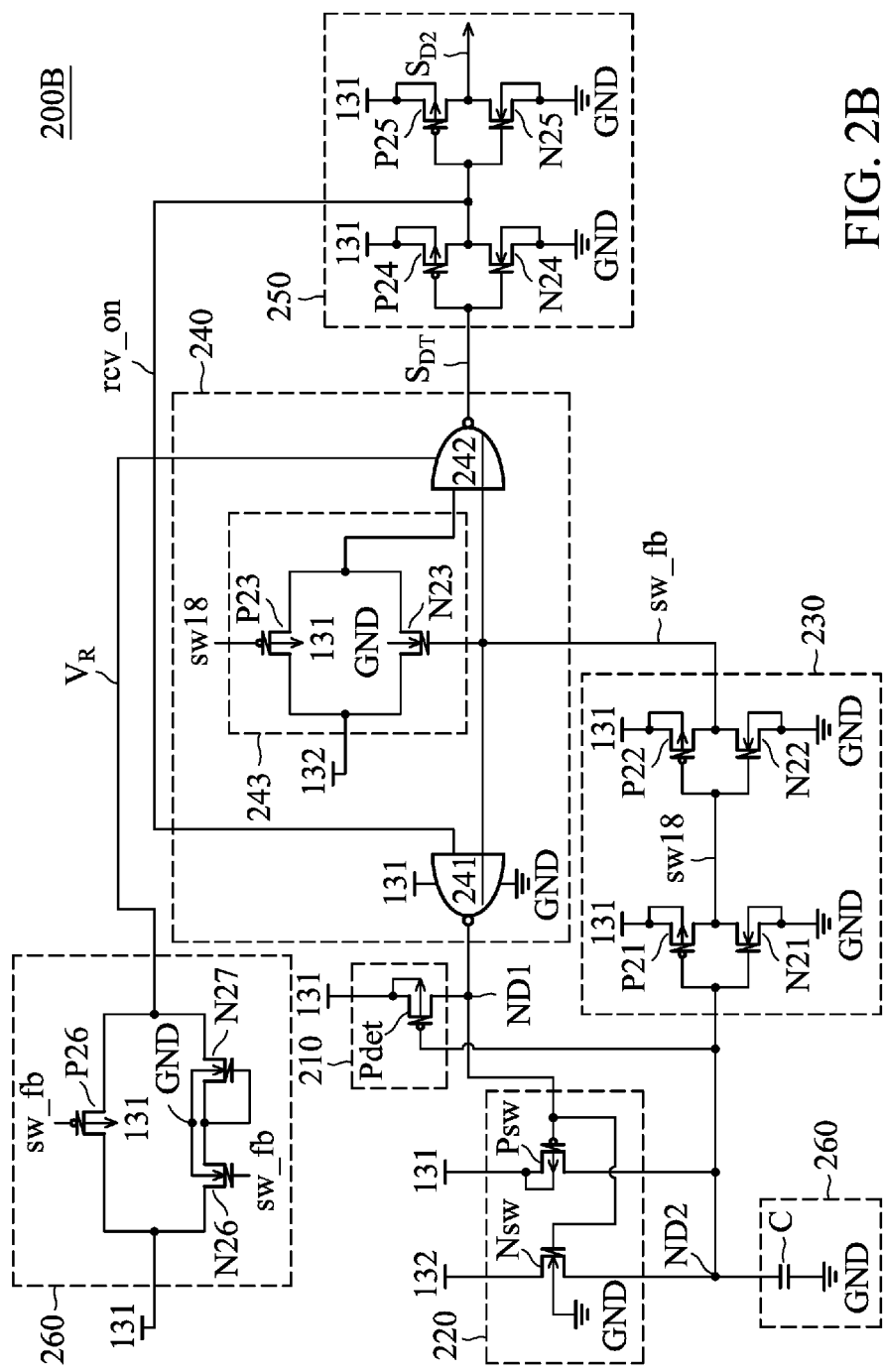
FIG. 2B is a schematic diagram of another exemplary embodiment of the power-on control circuit having a state-recovery mechanism, according to various aspects of the present disclosure.

FIG. 2B is a schematic diagram of another exemplary embodiment of the power-on control circuit having a state-recovery mechanism, according to various aspects of the present disclosure. FIG. 2B is similar to FIG. 2A with the exception that the power-on control circuit 200B further comprises a voltage supply circuit 260. The voltage supply circuit 260 is coupled between the voltage source 131 and the detection circuit 240 to provide power to the detection circuit 240. In this embodiment, the voltage supply circuit 260 provides power to the logic circuit 242.

When the voltage generated from the voltage source 131 reaches the first predetermined value and the voltage generated from the voltage source 132 has not reached the second predetermined value, the voltage supply circuit 260 directly provides the voltage generated from the voltage source 131 to the logic circuit 242. However, when the voltage generated from the voltage source 131 reaches the first predetermined value and the voltage generated from the voltage source 132 reaches the second predetermined value, the voltage supply circuit 260 reduces the voltage generated from the voltage source 131 to generate a decay voltage $V_R$ and provides the decay voltage $V_R$ to the logic circuit 242.

The circuit structure of the voltage supply circuit 260 is not limited in the present disclosure. In this embodiment, the voltage supply circuit 260 comprises a P-type transistor P26 and N-type transistors N26 and N27. The gate of the P-type transistor P26 receives the feedback signal sw_fb. The source of the P-type transistor P26 receives the voltage of the voltage source 131. The drain of the P-type transistor P26 is coupled to the detection circuit 240. The bulk of the P-type transistor P26 receives the voltage of the voltage source 131. When the P-type transistor P26 is turned on, the P-type transistor P26 transmits the voltage of the voltage source 131 to the logic circuit 242. Additionally, the gate of the N-type transistor N26 receives the feedback signal sw_fb. The drain of the N-type transistor N26 receives the voltage of the voltage source 131. The source of the N-type transistor N26 is coupled to the gate and the drain of the N-type transistor N27. The source of the N-type transistor N27 is coupled to the detection circuit 240. The bulks of the N-type transistors N26 and N27 receive the ground voltage GND. When the N-type transistors N26 and N27 are turned on, the N-type transistors N26 and N27 reduce the voltage of the voltage source 131 to generate the decay voltage $V_R$ and provide the decay voltage $V_R$ to the logic circuit 242.

Figure 2C:
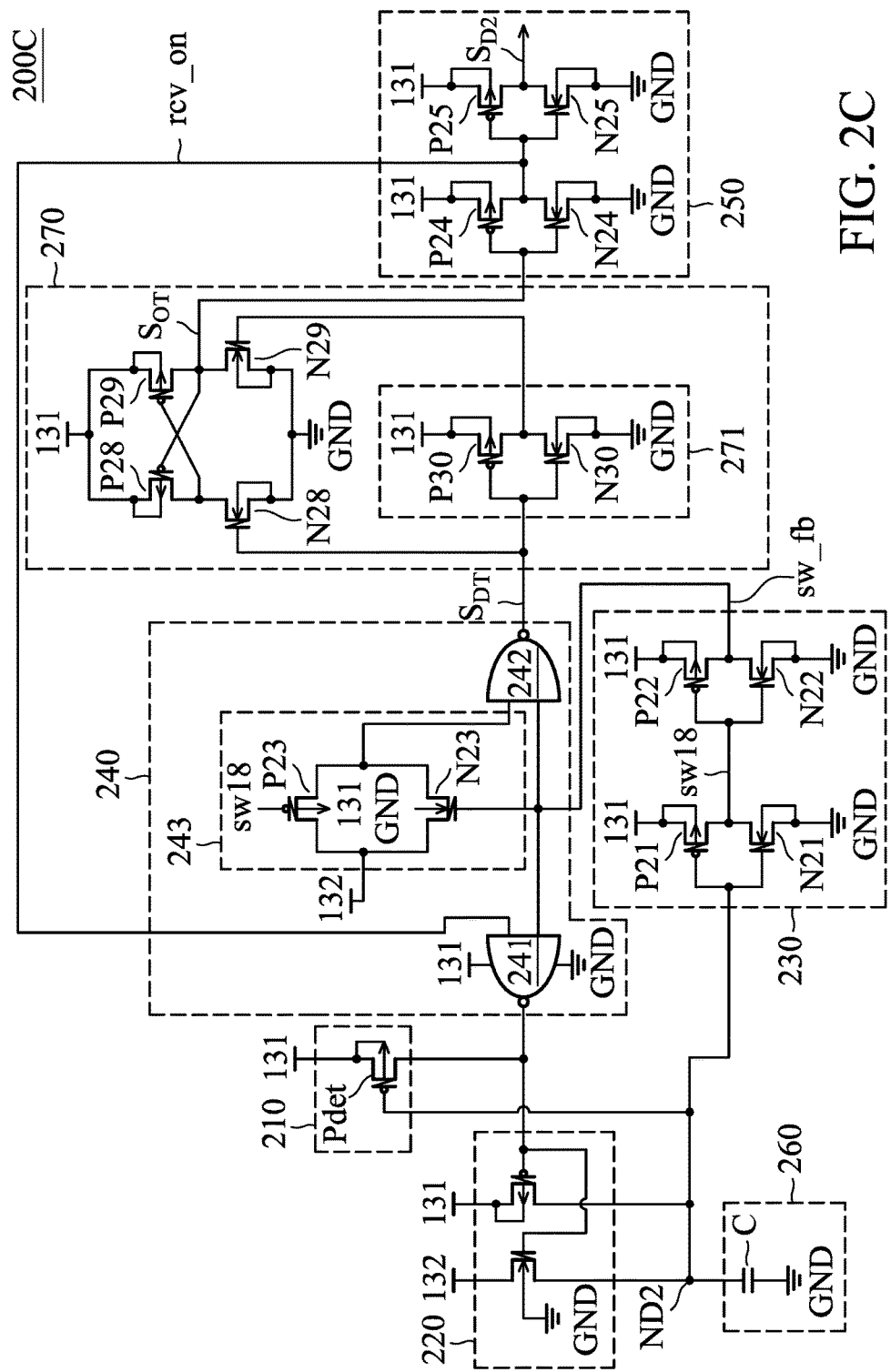
FIG. 2C is a schematic diagram of another exemplary embodiment of the power-on control circuit having a state-recovery mechanism, according to various aspects of the present disclosure.

FIG. 2C is a schematic diagram of another exemplary embodiment of the power-on control circuit having a state-recovery mechanism, according to various aspects of the present disclosure. FIG. 2C is similar to FIG. 2A with the exception that the power-on control circuit 200C further comprises a level shifter 270. The level shifter 270 is coupled between the detection circuit 240 and the buffer 250. In this embodiment, the level shifter 270 is configured to adjust the level of the detection signal $S_{DT}$ to generate an output signal $S_{OT}$. For example, when the detection signal $S_{DT}$ is at 1.8V, the level shifter 270 increases the level of the detection signal $S_{DT}$ from 1.8V to 3.3V. At this time, the output signal $S_{OT}$ is at 3.3V. When the detection signal $S_{DT}$ is at 0V, the level shifter 270 maintains the level of the detection signal $S_{DT}$. Therefore, the output signal $S_{OT}$ is at 0V. The buffer 250 generates the recovery signal rcv_on according to the output signal $S_{OT}$. In this embodiment, the level of the recovery signal rcv_on is opposite to the level of the output signal $S_{OT}$. For example, when the output signal $S_{OT}$ is at a high level (e.g. 3.3V), the recovery signal rcv_on is at a low level (e.g. 0V). When the output signal $S_{OT}$ is at a low level (e.g. 0V), the recovery signal rcv_on is at a high level (e.g. 3.3V).

The invention is not limited to the circuit structure of the level shifter 270. In one embodiment, the level shifter 270 comprises an inverter 271, P-type transistors P28~P30 and the N-type transistors N28~N30. The input terminal of the inverter 271 receives the detection signal $S_{DT}$. The output terminal of the inverter 271 is coupled to the gate of the N-type transistor N29. In this embodiment, the inverter 271 comprises a P-type transistor P30 and an N-type transistor N30. The gate of the P-type transistor P30 receives the detection signal $S_{DT}$. The source of the P-type transistor P30 receives the voltage of the voltage source 131. The drain of the P-type transistor P30 is coupled to the gate of the N-type transistor N29. The gate of the N-type transistor N30 receives the detection signal $S_{ST}$. The drain of the N-type transistor N30 is coupled to the drain of the P-type transistor P30. The source of the N-type transistor N30 receives the ground voltage GND.

The gate of the P-type transistor P28 is coupled to the buffer 250 and the drain of the P-type transistor P29. The source of the P-type transistor P28 receives the voltage generated from the voltage source 131. The drain of the P-type transistor P28 is coupled to the drain of the N-type transistor N28 and the gate of the P-type transistor P29. The gate of the N-type transistor N28 receives the detection signal $S_{DT}$. The source of the N-type transistor N28 receives the ground voltage GND. The gate of the P-type transistor P29 is coupled to the drain of the N-type transistor N28. The source of the P-type transistor P29 receives the voltage generated from the voltage source 131. The drain of the P-type transistor P29 is coupled to the buffer 250 and the drain of the N-type transistor N29. The gate of the N-type transistor N29 is coupled to the drain of the P-type transistor P30. The drain of the N-type transistor N29 is coupled to the drain of the P-type transistor P29. The source of the N-type transistor N29 receives the ground voltage GND.

Figure 2D:
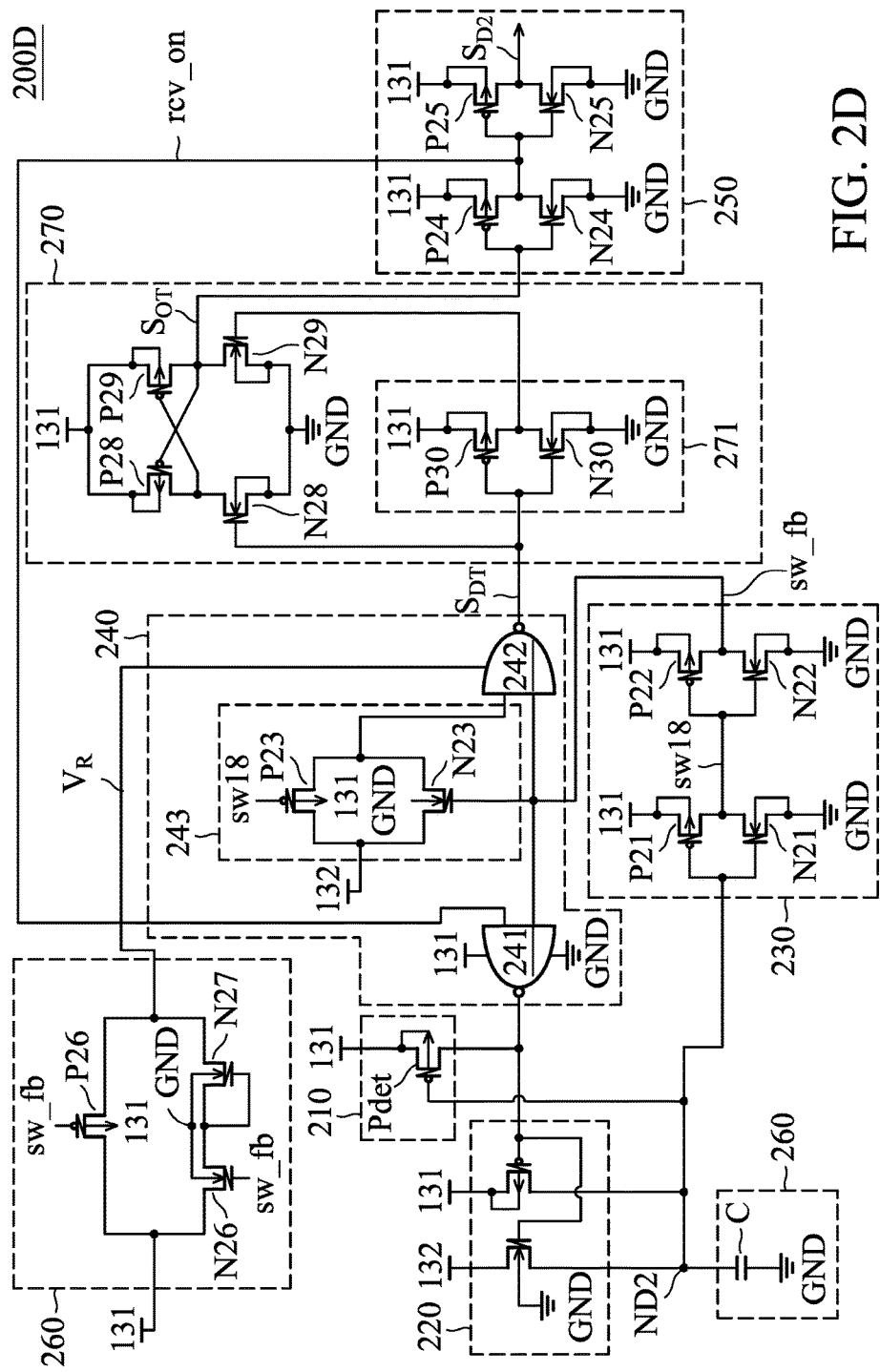
FIG. 2D is a schematic diagram of another exemplary embodiment of the power-on control circuit having a state-recovery mechanism, according to various aspects of the present disclosure.

FIG. 2D is a schematic diagram of another exemplary embodiment of the power-on control circuit having a state-recovery mechanism, according to various aspects of the present disclosure. FIG. 2D is similar to FIG. 2A with the exception that the power-on control circuit 200D of FIG. 2D further comprises a voltage supply circuit 260 and a level shifter 270. Since the operations of the voltage supply circuit 260 and the level shifter 270 have been described, the descriptions of the voltage supply circuit 260 and the level shifter 270 are omitted. In this embodiment, the voltage supply circuit 260 provides power to the logic circuit 242 and the inverter 271. The operation principle of the power-on control circuit 200D of FIG. 2D is described in the following paragraphs.

Figure 3B:
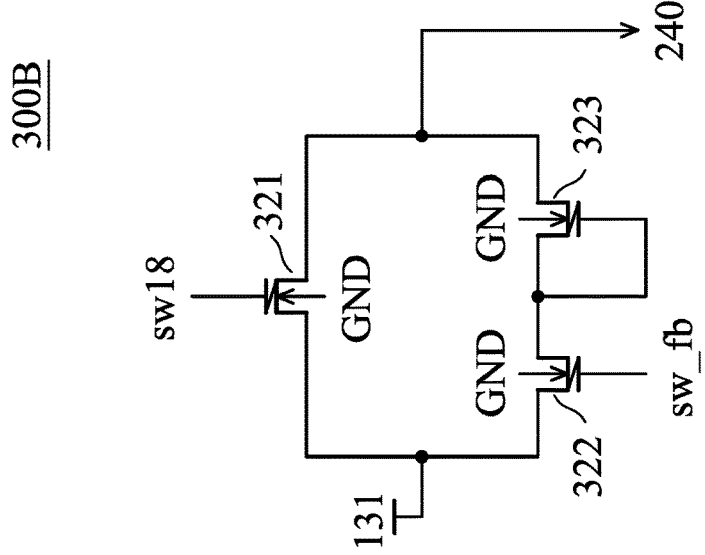
FIG. 3B is a schematic diagram of another exemplary embodiment of the voltage supply circuit, according to various aspects of the present disclosure.
Figure 3A:
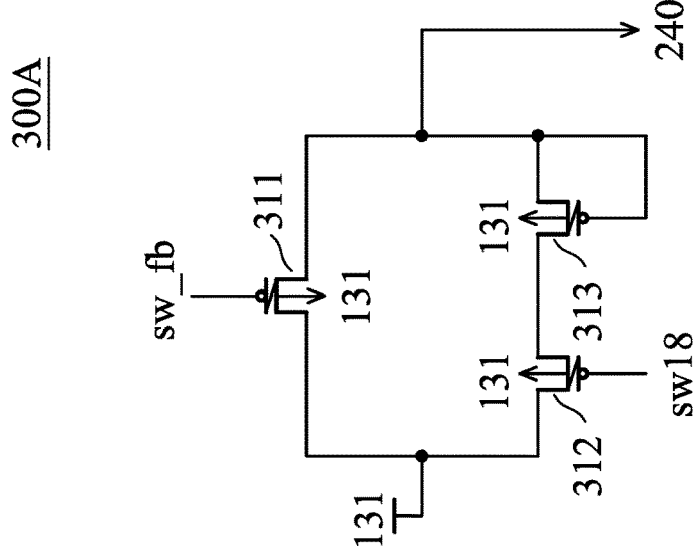
FIG. 3A is a schematic diagram of an exemplary embodiment of a voltage supply circuit, according to various aspects of the present disclosure.

FIG. 3A is a schematic diagram of an exemplary embodiment of a voltage supply circuit, according to various aspects of the present disclosure. The voltage supply circuit 300A comprises P-type transistors 311~313. The bulks of the P-type transistors 311~313 receive the voltage generated from the voltage source 131. Furthermore, the gate of the P-type transistor 311 receives the feedback signal sw_fb. The source of the P-type transistor 311 receives the voltage generated from the voltage source 131. The drain of the P-type transistor 311 is coupled to the detection circuit 240. The gate of the P-type transistor 312 receives the control signal sw18. The source of the P-type transistor 312 receives the voltage generated from the voltage source 131. The gate and the source of the P-type transistor 313 are coupled to the drain of the P-type transistor 312. The drain of the P-type transistor 313 is coupled to the detection circuit 240. In this embodiment, when the P-type transistor 311 is turned on, the P-type transistor 311 transmits the voltage generated from the voltage source 131 to the detection circuit 240. When the P-type transistors 312 and 313 are turned on, the P-type transistors 312 and 313 reduce the voltage generated from the voltage source 131 and transmit the reduced voltage to the detection circuit 240.

FIG. 3B is a schematic diagram of another exemplary embodiment of the voltage supply circuit, according to various aspects of the present disclosure. The voltage supply circuit 300B comprises N-type transistors 321~323. In this embodiment, the bulks of the N-type transistors 321~323 receive the ground voltage GND. Additionally, the gate of the N-type transistor 321 receives the control signal sw18. The drain of the N-type transistor 321 receives the voltage generated from the voltage source 131. The source of the N-type transistor 321 is coupled to the detection circuit 240. The gate of the N-type transistor 322 receives the feedback signal sw_fb. The drain of the N-type transistor 322 receives the voltage generated from the voltage source 131. The gate and the drain of the N-type transistor 323 are coupled to the source of the N-type transistor 322. The source of the N-type transistor 323 is coupled to the detection circuit 240. In this embodiment, when the N-type transistor 321 is turned on, the N-type transistor 321 transmits the voltage generated from the voltage source 131 to the detection circuit 240. When the N-type transistors 322 and 323 are turned on, the N-type transistors 322 and 323 reduce the voltage generated from the voltage source 131 and transmit the reduced voltage to the detection circuit 240.

Figure 3D:
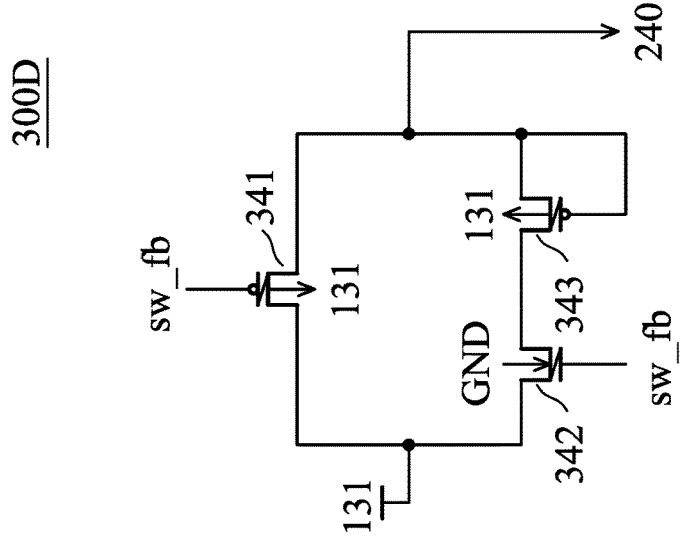
FIG. 3D is a schematic diagram of another exemplary embodiment of the voltage supply circuit, according to various aspects of the present disclosure.
Figure 3C:
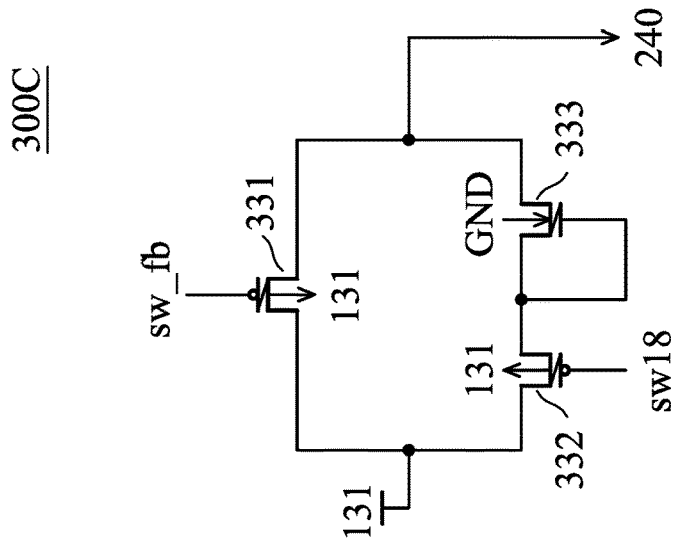
FIG. 3C is a schematic diagram of another exemplary embodiment of the voltage supply circuit, according to various aspects of the present disclosure.

FIG. 3C is a schematic diagram of another exemplary embodiment of the voltage supply circuit, according to various aspects of the present disclosure. The voltage supply circuit 300C comprises P-type transistors 331 and 332 and an N-type transistor 333. The bulks of the P-type transistors 331 and 332 receive the voltage generated from the voltage source 131. Furthermore, the gate of the P-type transistor 331 receives the feedback signal sw_fb. The source of the P-type transistor 331 receives the voltage generated from the voltage source 131. The drain of the P-type transistor 331 is coupled to the detection circuit 240. The gate of the P-type transistor 332 receives the control signal sw18. The source of the P-type transistor 332 receives the voltage generated from the voltage source 131. The gate and the drain of the N-type transistor 333 are coupled to the drain of the P-type transistor 332. The source of the N-type transistor 333 is coupled to the detection circuit 240. The bulk of the N-type transistor 333 receives the ground voltage GND.

In this embodiment, when the P-type transistor 331 is turned on, the P-type transistor 332 and the N-type transistor 333 are turned off. Therefore, the P-type transistor 331 transmits the voltage generated from the voltage source 131 to the detection circuit 240. When the P-type transistor 332 and the N-type transistor 333 are turned on, the P-type transistor 331 is turned off. At this time, the P-type transistor 332 and the N-type transistor 333 decays the voltage generated from the voltage source 131 and provides the decayed voltage to the detection circuit 240.

FIG. 3D is a schematic diagram of another exemplary embodiment of the voltage supply circuit, according to various aspects of the present disclosure. The voltage supply circuit 300D comprises P-type transistors 341 and 343 and an N-type transistor 342. The bulks of the P-type transistors 341 and 343 receive the voltage of the voltage source 131. The gate of the P-type transistor 341 receives the feedback signal sw_fb. The source of the P-type transistor 341 receives the voltage of the voltage source 131. The drain of the P-type transistor 341 is coupled to the detection circuit 240. The gate of the N-type transistor 342 receives the feedback signal sw_fb. The drain of the N-type transistor 342 receives the voltage of the voltage source 131. The source of the P-type transistor 343 is coupled to the source of the N-type transistor 342. The gate and the drain of the P-type transistor 343 are coupled to the detection circuit 240.

In this embodiment, when the P-type transistor 341 is turned on, the N-type transistor 342 and the P-type transistor 343 are turned off. Therefore, the P-type transistor 341 transmits the voltage of the voltage source 131 to the detection circuit 240. When the N-type transistor 342 and the P-type transistor 343 are turned on, the P-type transistor 341 is turned off. Therefore, the N-type transistor 342 and the P-type transistor 343 decay the voltage of the voltage source 131 and transmit the decayed voltage to the detection circuit 240.

Figure 4A:
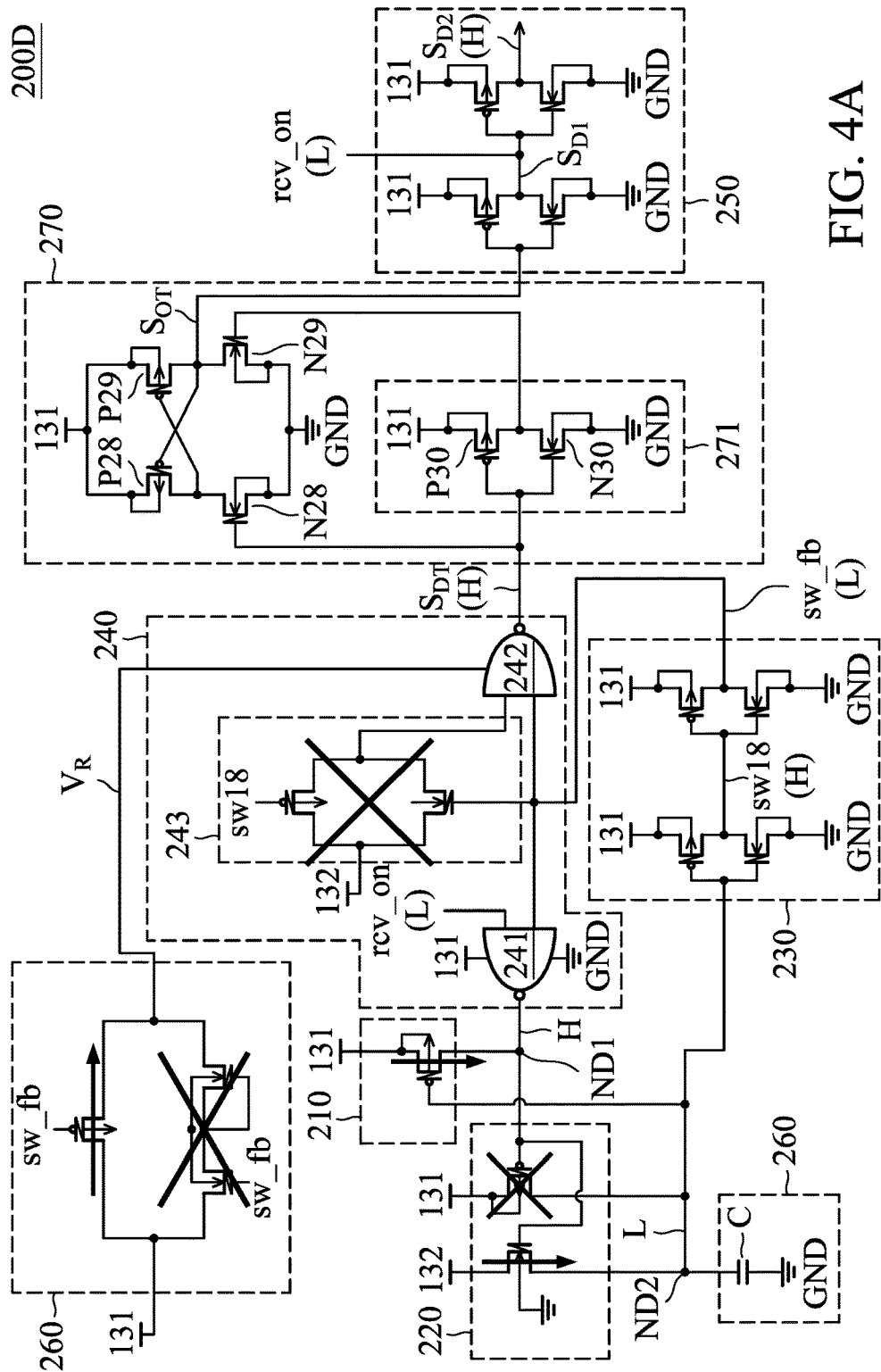
FIG. 4A is a schematic diagram of the power-on control circuit entering a power-on mode, according to various aspects of the present disclosure.
Figure 4B:
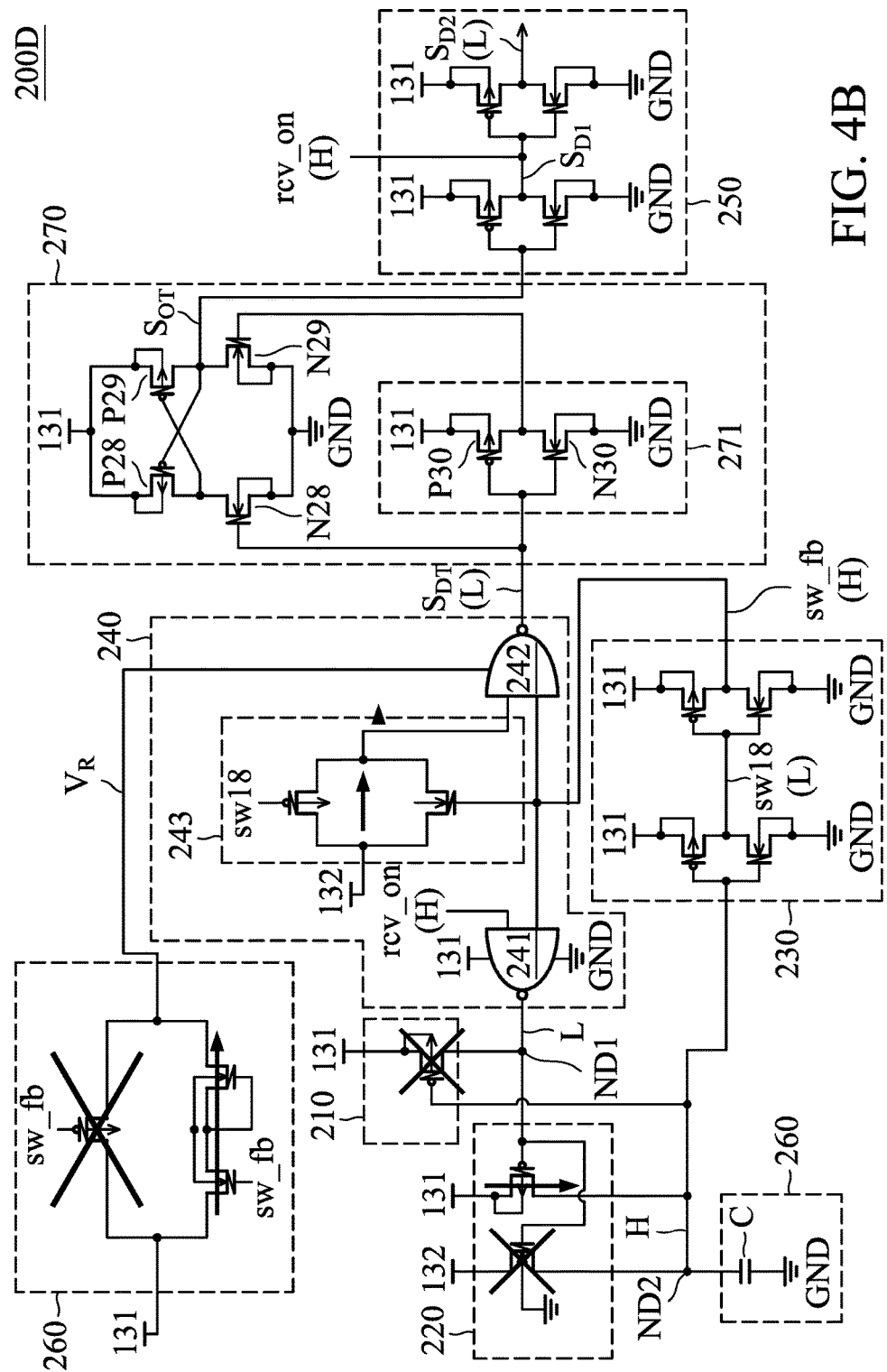
FIG. 4B is a schematic diagram of the power-on control circuit entering a normal mode, according to various aspects of the present disclosure.
Figure 4C:
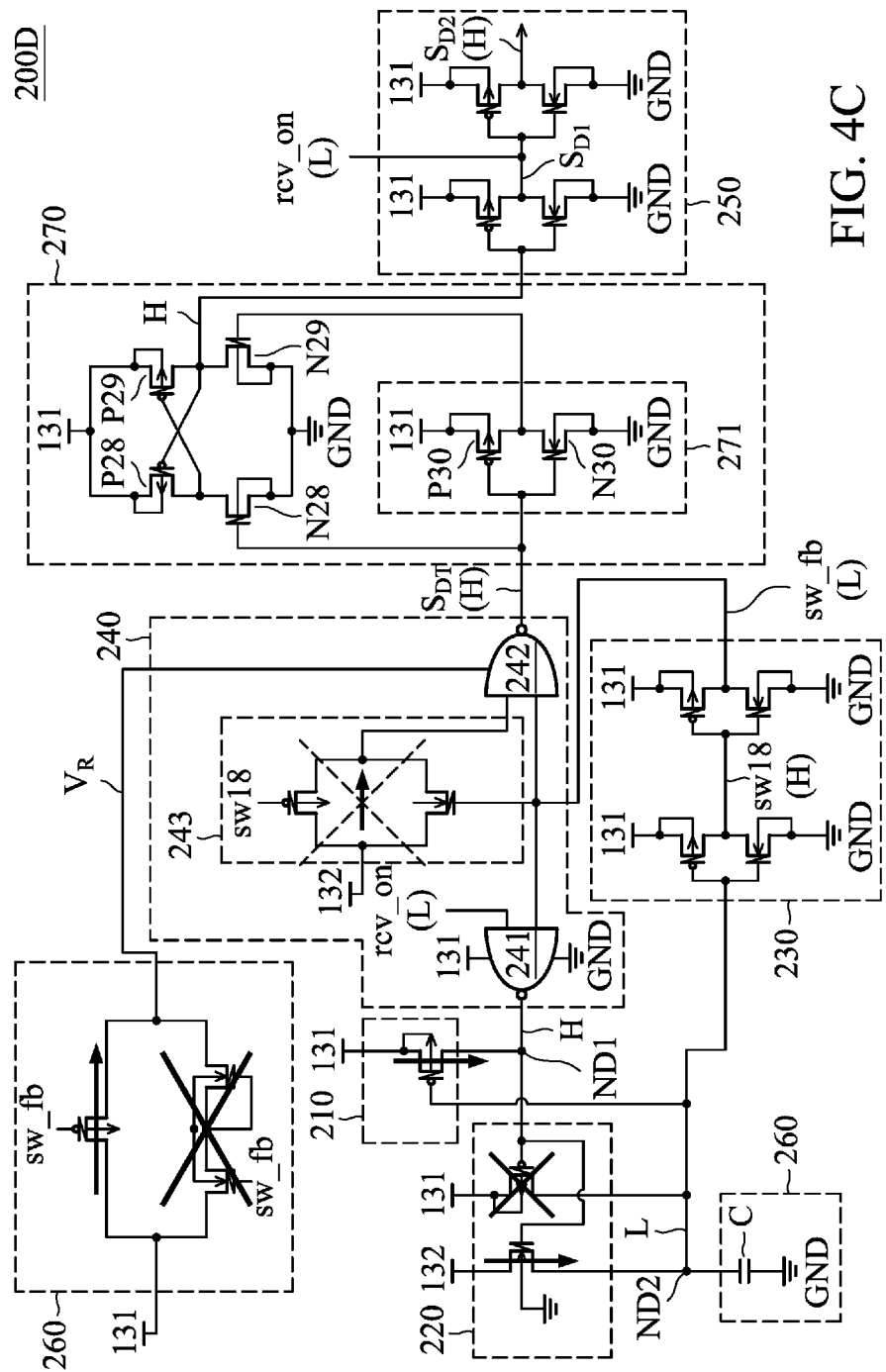
FIG. 4C is a schematic diagram of the power-on control circuit entering a power-off mode, according to various aspects of the present disclosure.

FIGS. 4A~4C are schematic diagrams of the operations of the power-on control circuit according to various aspects of the present disclosure. To brevity, the power-on control circuit 200D is given an example to describe the operations of the power-on control circuit 200D. When the voltage sources 131 and 132 start outputting voltages, the voltages output from the voltage sources 131 and 132 are gradually increased. When the voltage generated from the voltage source 131 reaches a first predetermined value and the voltage generated from the voltage source 132 has not reached a second predetermined value, the power-on control circuit 200D enters a power-on mode.

In the power-on mode, the initial voltage level of the node ND2 is a low level such that the detection circuit 210 transmits the voltage generated from the voltage source 131 to the node ND1. Therefore, the voltage level of the node ND1 is a high level such that the switching circuit 220 transmits the voltage generated from the voltage source 132 to the node ND2. Since the voltage generated from the voltage source 132 has not reached the second predetermined value, the voltage level of the node ND2 is maintained at the low level. Therefore, the buffer 230 outputs the control signal sw18 having a high level and the feedback signal sw_fb having a low level.

Since the feedback signal sw_fb is at the low level, the logic circuit 241 sets the voltage level of the node ND1 to the high level. Therefore, the switching circuit 220 still outputs the voltage generated from the voltage source 132 to the node ND2. Additionally, since the feedback signal sw_fb is at the low level such that the logic circuit 242 outputs the detection signal $S_{ST}$ having the high level. At this time, the buffer 250 outputs the recovery signal rcv_on having the low level.

In one embodiment, the recovery signal rcv_on serves as a first driving signal to drive the control switch 113 shown in FIG. 1. In another embodiment, the buffer 250 further outputs a driving signal $S_{D2}$ having a high level. In such cases, the driving signal $S_{D2}$ is capable of serving as a second driving signal to drive the control switch 114 shown in FIG. 1. In other embodiments, the buffer 250 further comprises an inverter (not shown) to invert the driving signal $S_{D2}$ to generate a third driving signal. In this case, the third driving signal is utilized to drive the control switch 113 shown in FIG. 1. Furthermore, since the feedback signal sw_fb is at the low level and the control signal sw18 is at the high level, the transmission gate 243 is turned off. Additionally, since the feedback signal sw_fb is at the low level, the voltage supply circuit 260 provides the voltage generated from the voltage source 131 to the logic circuit 242.

Refer to FIG. 4B, when the voltage generated from the voltage source 131 reaches the first predetermined value and the voltage generated from the voltage source 132 reaches the second predetermined value, the voltage level of the node ND2 is changed from the low level to the high level. Therefore, the power-on control circuit 200D enters a normal mode. In the normal mode, the buffer 230 generates the control signal sw18 having a low level and the feedback signal sw_fb having a high level. Since the feedback signal sw_fb is at the high level, the transmission gate 243 provides the voltage generated from the voltage source 132 to the logic circuit 242. Since the voltage generated from the voltage source 132 has reached the second predetermined value, the logic circuit 242 outputs the detection signal $S_{DT}$ having the low level. At this time, the buffer 250 outputs the recovery signal rcv_on having the high level and the driving signal $S_{D2}$ having the low level.

Since the recovery signal rcv_on and the feedback signal sw_fb are at the high level, the logic circuit 241 sets the voltage level of the node ND1 to the low level. Therefore, the switching circuit 220 outputs the voltage generated from the voltage source 131 to the node ND2. Since the voltage generated from the voltage source 131 has reached the first predetermined value, the voltage level of the node ND2 is maintained at the high level. Additionally, the recovery signal rcv_on may serve the driving signal $S_{D1}$ shown in FIG. 1. Therefore, the control switch 113 is turned off. In addition, since the driving signal $S_{D2}$ is at the low level, the control switch 114 is also turned off. At this time, the output switches 115 and 116 are controlled by the core circuit 111. Furthermore, in the normal mode, the voltage supply circuit 260 decays the voltage generated from the voltage source 131 to generate the decay voltage $V_R$ to the logic circuit 242.

Refer to FIG. 4C, when the voltage source 132 stops outputting the voltage, the voltage output from the voltage source 132 is gradually reduced. When the voltage output from the voltage source 132 is lower than the second predetermined value, the power-on control circuit 200D enters a power-off mode. In the power-off mode, since the voltage output from the voltage source 132 is lower than the second predetermined value, the transmission gate 243 transmits a low level to the logic circuit 242. Therefore, the logic circuit 242 outputs the detection signal $S_{DT}$ having a high level. At this time, the buffer 250 outputs the recovery signal rcv_on having the low level such that the logic circuit 241 outputs the high level to the node ND1. Therefore, the switching unit 220 outputs the voltage output from the voltage source 132 to the node ND2. Since the voltage output from the voltage source 132 is lower than the second predetermined value, the voltage level of the node ND2 is the low level.

At this time, the buffer 230 outputs the control signal sw18 having the high level and the feedback signal sw_fb having the low level. Therefore, the voltage supply circuit 260 provides the voltage generated from the voltage source 131 to the logic circuit 242. The logic circuit 242 outputs the detection signal $S_{DT}$ having the high level such that the buffer 250 outputs the recovery signal rcv_on having the low level. When the recovery signal rcv_on serves as the driving signal $S_{D1}$ shown in FIG. 1, the control switch 113 is turned on to turn off the output switch 115. Furthermore, since the buffer 250 outputs the driving signal $S_{D2}$ having the high level, the control switch 114 shown in FIG. 1 is turned on. Therefore, the output switch 116 is turned off. Since the output switches 115 and 116 are turned off, the leakage current can be avoided.

In the embodiments above, when the voltage generated from the voltage source 131 has reached the first predetermined value and the voltage generated from the voltage source 132 has not reached the second predetermined value, the power-on control circuit 200D enters a power-off mode. In the power-off mode, the power-on control circuit 200D controls the output switches 115 and 116 to prevent the output switches 115 and 116 from being turned on simultaneously. When the voltage generated from the voltage source 132 reaches the second predetermined value, the power-on control circuit 200D enters the normal mode. In the normal mode, the power-on control circuit 200D does not control the output switches 115 and 116. At this time, the output switches 115 and 116 are controlled by the core circuit 111. When the voltage source 132 stops generating the voltage, the voltage generated from the voltage source 132 is gradually reduced. When the voltage generated from the voltage source 132 is lower than the second predetermined value, the power-on control circuit 200D enters a power-off mode. In the power-off mode, the power-on control circuit 200D controls the output switches 115 and 116 again to prevent the output switches 115 and 116 from being turned on simultaneously and a leakage current passing through the output switches 115 and 116.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A power-on control circuit, comprising:
a first detection circuit detecting a voltage of a first voltage source to generate a first detection signal to a first node;
a switching circuit coupled to the first voltage source and a second voltage source and outputting the voltage of the first voltage source or a voltage of the second voltage source to a second node according to a voltage level of the first node;
a first buffer generating a feedback signal and a control signal according to a voltage level of the second node;
a second detection circuit generating a second detection signal according to the feedback signal, the control signal, the voltage of the second voltage source and a recovery signal; and
a second buffer generating the recovery signal according to the second detection signal.

2. The power-on control circuit as claimed in claim 1,
wherein when the voltage of the first voltage source reaches a first predetermined value and the voltage of the second voltage source has not reached a second predetermined value, the power-on control circuit enters a first mode, and
wherein in the first mode, the first detection circuit transmits the voltage of the first voltage source to the first node, the switching circuit outputs the voltage of the second voltage source to the second node, the second detection circuit generates the second detection signal according to the feedback signal, and the second buffer generates the recovery signal having a first level according to the second detection signal.

3. The power-on control circuit as claimed in claim 2,
wherein when the voltage of the first voltage source reaches the first predetermined value and the voltage of the second voltage source reaches the second predetermined value, the power-on control circuit enters a second mode, and
wherein in the second mode, the voltage level of the second node is a second level, the first buffer generates the feedback signal according to the voltage level of the second node, the second detection circuit changes the voltage level of the first node and generates the second detection signal according to the feedback signal, the switching circuit outputs the voltage of the first voltage source to the second node according to the voltage level of the first node, the second buffer generates the recovery signal having the second level according to the second detection signal, and the second level is higher than the first level.

4. The power-on control circuit as claimed in claim 3,
wherein when the voltage of the second voltage source is reduced and lower than the second predetermined value, the power-on control circuit enters a third mode, and
wherein in the third mode, the second detection circuit generates the second detection signal according to the voltage of the second voltage source, the second buffer generates the recovery signal having the first level according to the second detection signal to change the voltage level of the first node, and the switching circuit outputs the voltage of the second voltage source to the second node according to the voltage level of the first node.

5. The power-on control circuit as claimed in claim 1, further comprising:
a level shifter coupled between the second detection circuit and the second buffer, wherein the level shifter adjusts the level of the second detection signal to generate an output signal, and the second buffer generates the recovery signal according to the output signal.

6. The power-on control circuit as claimed in claim 1, further comprising:
a voltage supply circuit coupled between the first voltage source and the second detection circuit, wherein in the first mode, the voltage supply circuit provides the voltage of the first voltage source to the second detection circuit, and in the second mode, the voltage supply circuit reduces the voltage of the first voltage source to generate a decay voltage and provides the decay voltage to the second detection circuit.

7. The power-on control circuit as claimed in claim 6, wherein the voltage supply circuit comprises:
a P-type transistor comprising a gate receiving the feedback signal, a source coupled to the first voltage source and a drain coupled to the second detection circuit;
a first N-type transistor comprising a gate receiving the feedback signal and a drain coupled to the first voltage source;
a second N-type transistor comprising a gate coupled to a source of the first N-type transistor, a drain coupled to the source of the first N-type transistor, and a source coupled to the second detection circuit.

8. The power-on control circuit as claimed in claim 6, wherein the voltage supply circuit comprises:

a first P-type transistor comprising a gate receiving the feedback signal, a source coupled to the first voltage source, and a drain coupled to the second detection circuit;

a second P-type transistor comprising a gate receiving the control signal and a source coupled to the first voltage source;

a third P-type transistor comprising a gate coupled to a drain of the second P-type transistor, a source coupled to the drain of the second P-type transistor, and a drain coupled to the second detection circuit.

9. The power-on control circuit as claimed in claim 1, wherein the voltage supply circuit comprises:

a first N-type transistor comprising a gate receiving the control signal, a drain coupled to the first voltage source, and a source coupled to the second detection circuit;

a second N-type transistor comprising a gate receiving the feedback signal and a drain coupled to the first voltage source; and a third N-type transistor comprising a gate coupled to a source of the second N-type transistor, a drain coupled to the source of the second N-type transistor, and a source coupled to the second detection circuit.

10. The power-on control circuit as claimed in claim 1, wherein the second detection circuit comprises:

a first logic circuit receiving the feedback signal and the voltage of the second voltage source and outputting the second detection signal;

a transmission gate coupled between the second voltage source and the first logic circuit; and a second logic circuit receiving the feedback signal and the recovery signal and coupled to the first node.

11. An operating circuit comprising:

a core circuit receiving a voltage provided from a first voltage source and a voltage provided from a second voltage source and generating a first control signal and a second control signal;

a first output switch transmitting the voltage provided from the first voltage source to a pad according to the first control signal;

a second output switch transmitting a ground voltage to the pad according to the second control signal; and a power-on control circuit controlling the first and second output switches according to the voltage provided from the first voltage source and the voltage provided from the second voltage source and comprising a first detection circuit detecting the voltage provided from the first voltage source to generate a first detection signal to a first node;

a switching circuit coupled to the first and second voltage sources and outputting the voltage provided from the first or second voltage source to a second node according to a voltage level of the first node;

a first buffer generating a feedback signal and a control signal according to a voltage level of the second node;

a second detection circuit generating a second detection signal according to the feedback signal, the control signal, the voltage provided from the second voltage source and a recovery signal; and a second buffer generating the recovery signal according to the second detection signal and controlling the first and second output switches according to the second detection signal.

12. The operating circuit as claimed in claim 11, wherein when the voltage provided from the first voltage source reaches a first predetermined value and the voltage provided from the second voltage source has not reached a second predetermined value, the power-on control circuit enters a first mode, and wherein in the first mode, the first detection circuit transmits the voltage provided from the first voltage source to the first node, the switching circuit outputs the voltage provided from the second voltage source to the second node, the second detection circuit generates the second detection signal according to the feedback signal, and the second buffer generates the recovery signal having a first level according to the second detection signal.

13. The operating circuit as claimed in claim 12, wherein when the voltage provided from the first voltage source reaches the first predetermined value and the voltage provided from the second voltage source reaches the second predetermined value, the power-on control circuit enters a second mode, and wherein in the second mode, the voltage level of the second node is a second level, the first buffer generates the feedback signal according to the voltage level of the second node, the second detection circuit changes the voltage level of the first node and generates the second detection signal according to the feedback signal, the switching circuit outputs the voltage provided from the first voltage source to the second node according to the voltage level of the first node, the second buffer generates the recovery signal having the second level according to the second detection signal, and the second level is higher than the first level.

14. The operating circuit as claimed in claim 13, wherein when the voltage provided from the second voltage source is reduced and lower than the second predetermined value, the power-on control circuit enters a third mode, and wherein in the third mode, the second detection circuit generates the second detection signal according to the voltage provided from the second voltage source, the second buffer generates the recovery signal having the first level according to the second detection signal to change the voltage level of the first node, and the switching circuit outputs the voltage provided from the second voltage source to the second node according to the voltage level of the first node.

15. The operating circuit as claimed in claim 11, further comprising:

a level shifter coupled between the second detection circuit and the second buffer, wherein the level shifter adjusts the level of the second detection signal to generate an output signal, and the second buffer generates the recovery signal according to the output signal.

16. The operating circuit as claimed in claim 11, further comprising:

a voltage supply circuit coupled between the first voltage source and the second detection circuit, wherein in the first mode, the voltage supply circuit provides the voltage provided from the first voltage source to the second detection circuit, and in the second mode, the voltage supply circuit reduces the voltage provided from the first voltage source to generate a decay voltage and provides the decay voltage to the second detection circuit.

17. The operating circuit as claimed in claim 16, wherein the voltage supply circuit comprises:

a P-type transistor comprising a gate receiving the feedback signal, a source coupled to the first voltage source and a drain coupled to the second detection circuit;

a first N-type transistor comprising a gate receiving the feedback signal and a drain coupled to the first voltage source;

a second N-type transistor comprising a gate coupled to a source of the first N-type transistor, a drain coupled to the source of the first N-type transistor, and a source coupled to the second detection circuit.

18. The operating circuit as claimed in claim 16, wherein the voltage supply circuit comprises:

a first P-type transistor comprising a gate receiving the feedback signal, a source coupled to the first voltage source, and a drain coupled to the second detection circuit;

a second P-type transistor comprising a gate receiving the control signal and a source coupled to the first voltage source;

a third P-type transistor comprising a gate coupled to a drain of the second P-type transistor, a source coupled to the drain of the second P-type transistor, and a drain coupled to the second detection circuit.

19. The operating circuit as claimed in claim 11, wherein the voltage supply circuit comprises:

a first N-type transistor comprising a gate receiving the control signal, a drain coupled to the first voltage source, and a source coupled to the second detection circuit;

a second N-type transistor comprising a gate receiving the feedback signal and a drain coupled to the first voltage source; and a third N-type transistor comprising a gate coupled to a source of the second N-type transistor, a drain coupled to the source of the second N-type transistor, and a source coupled to the second detection circuit.

20. The operating circuit as claimed in claim 11, wherein the second detection circuit comprises:

a first logic circuit receiving the feedback signal and the voltage provided from the second voltage source and outputting the second detection signal;

a transmission gate coupled between the second voltage source and the first logic circuit; and a second logic circuit receiving the feedback signal and the recovery signal and coupled to the first node.

* * * * *